United States Patent
Arai et al.

[11] Patent Number: 6,110,287
[45] Date of Patent: Aug. 29, 2000

[54] PLASMA PROCESSING METHOD AND PLASMA PROCESSING APPARATUS

[75] Inventors: Izumi Arai, Yokohama; Yoshifumi Tahara; Hiroshi Nishikawa, both of Tokyo, all of Japan; Yoshinobu Mitano, Mt. View, Calif.; Shunichi Iimuro, Yamanashi-ken, Japan; Kazuo Fukasawa; Yutaka Miura, both of Kofu, Japan; Shozo Hosoda, Yamanashi-ken, Japan

[73] Assignees: Tokyo Electron Limited, Tokyo; Tokyo Electron Yamanashi Limited, Nirasaki, both of Japan

[21] Appl. No.: 08/843,129

[22] Filed: Apr. 28, 1997

Related U.S. Application Data

[63] Continuation of application No. 08/220,683, Mar. 31, 1994, abandoned.

[30] Foreign Application Priority Data

| Mar. 31, 1993 | [JP] | Japan | 5-098445 |
| May 19, 1993 | [JP] | Japan | 5-140031 |
| Dec. 22, 1993 | [JP] | Japan | 5-346196 |

[51] Int. Cl.$^7$ .................................................. C23C 16/00
[52] U.S. Cl. .......................................... 118/723; 156/345
[58] Field of Search ........................... 156/345; 118/723 E

[56] References Cited

U.S. PATENT DOCUMENTS

| 4,908,095 | 3/1990 | Kagatsume et al. | 156/345 |
| 5,074,456 | 12/1991 | Degner et al. | 156/345 |
| 5,147,497 | 9/1992 | Nozawa et al. | 156/345 |

FOREIGN PATENT DOCUMENTS

| 56-33839 | 4/1981 | Japan . |
| 4-54373 | 8/1992 | Japan . |
| 5-70930 | 10/1993 | Japan . |

*Primary Examiner*—Thi Dang
*Attorney, Agent, or Firm*—Oblon, Spivak, McClelland, Maier & Neustadt, P.C.

[57] ABSTRACT

A plasma processing method in which a high-frequency power is supplied to a processing chamber in which an object to be processed is mounted, thereby producing a plasma in the processing chamber, and the object is processed in an atmosphere of the plasma, wherein the high-frequency power is subjected to modulation by a low-frequency power. In one embodiment a plasma is produced in a processing chamber by using an electric power with a direction of current changed with passing of time, and the object to be processed is processed in an atmosphere of the plasma, wherein a power having a basic frequency is subjected to frequency modulation with a frequency equal to n-times (n=an integer) the basic frequency. In a plasma processing apparatus of the invention, while a process gas is supplied to a processing chamber via a first gas introducing hole formed in an electrode, an object to be processed, which is held on an opposed electrode, is subjected to plasma processing. There is provided a resistance applying [means for applying] apply resistance to the process gas flowing to the processing chamber via the gas introducing hole from the gas introducing means such that a plasma discharge is prevented from occurring in the gas introducing means when a process pressure in the processing chamber is set at 0.5 Torr or less.

2 Claims, 9 Drawing Sheets

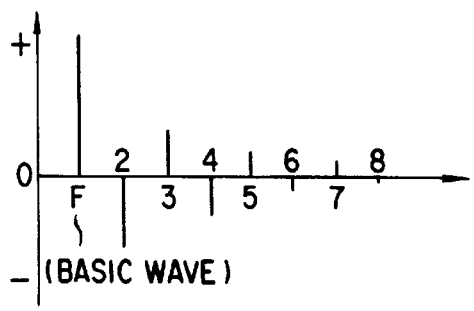
F I G. 5
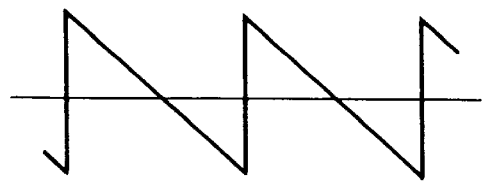
F I G. 6
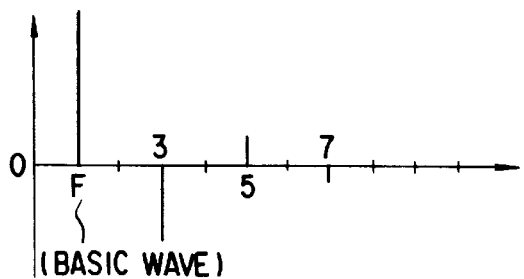
F I G. 7
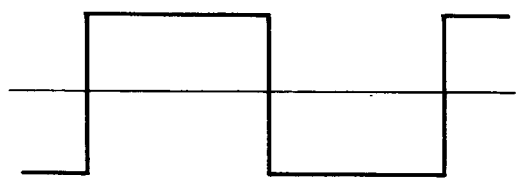
F I G. 8
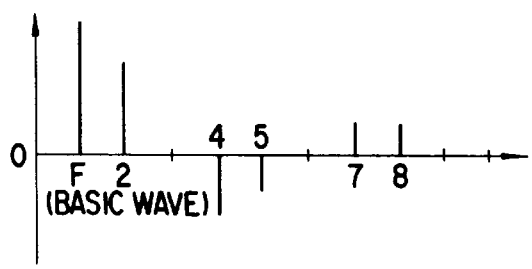
F I G. 9
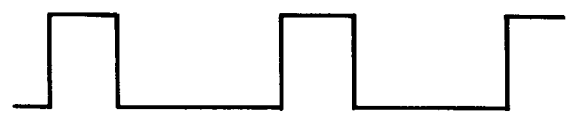
F I G. 10
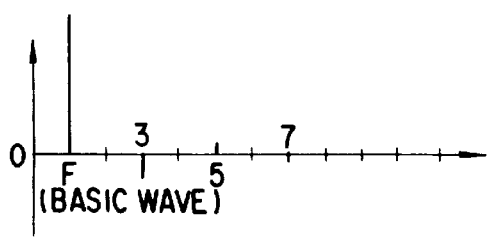
F I G. 11
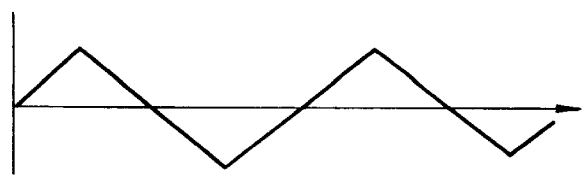
F I G. 12

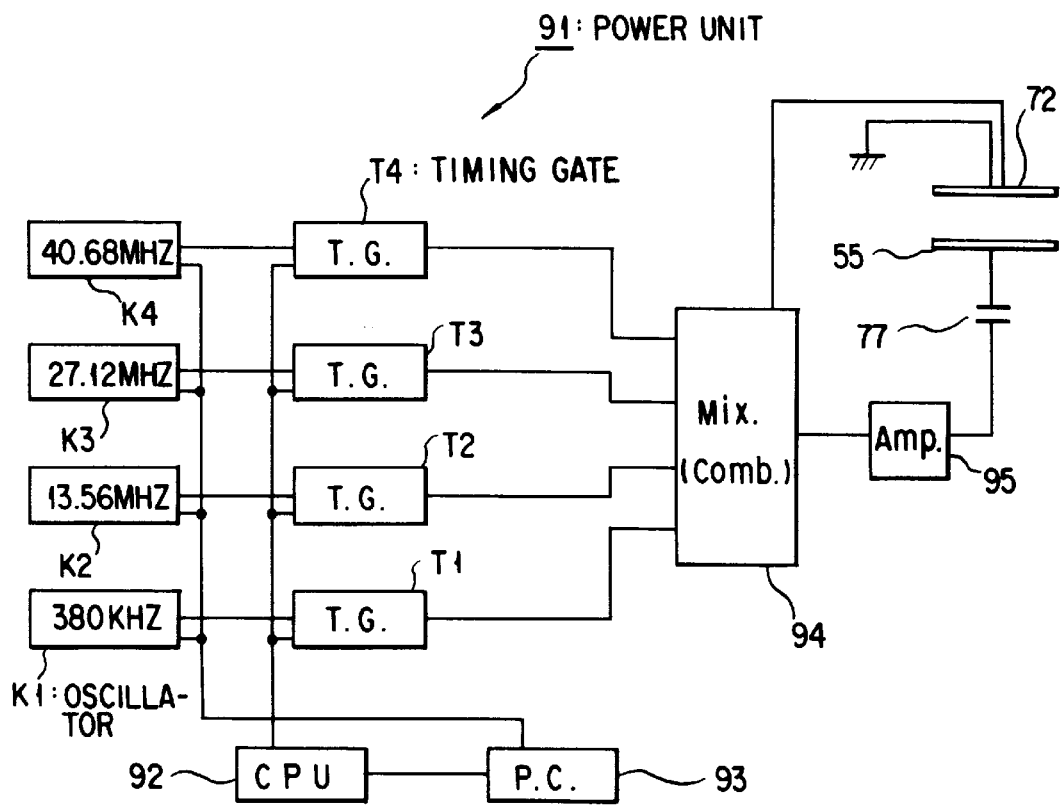
F I G. 13
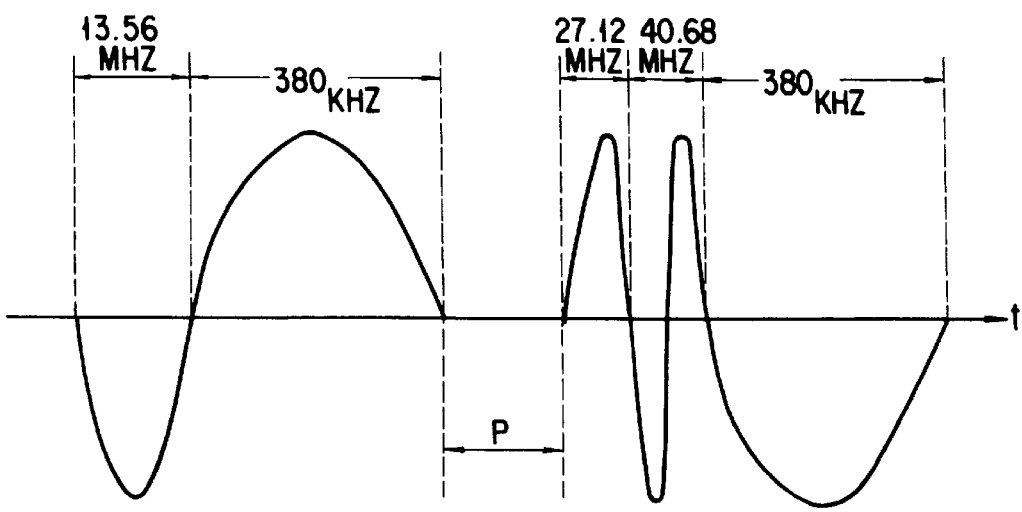
F I G. 14

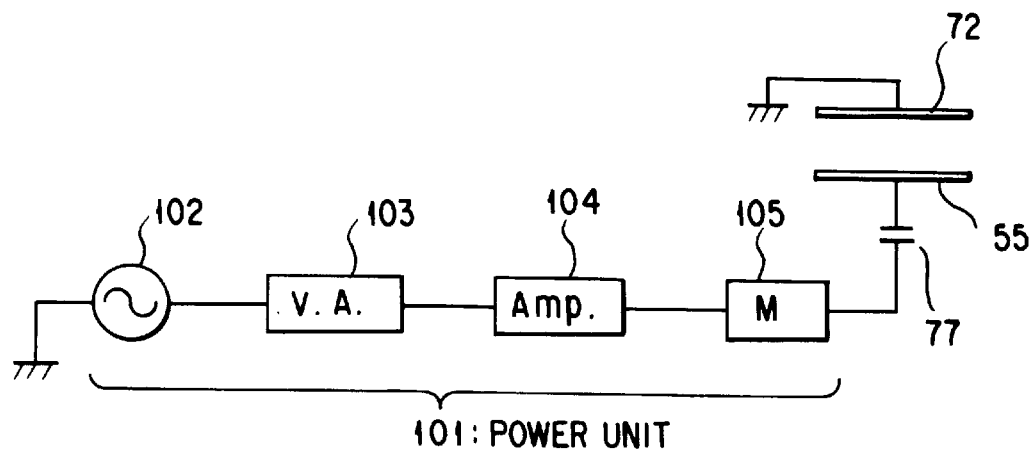
F I G. 15
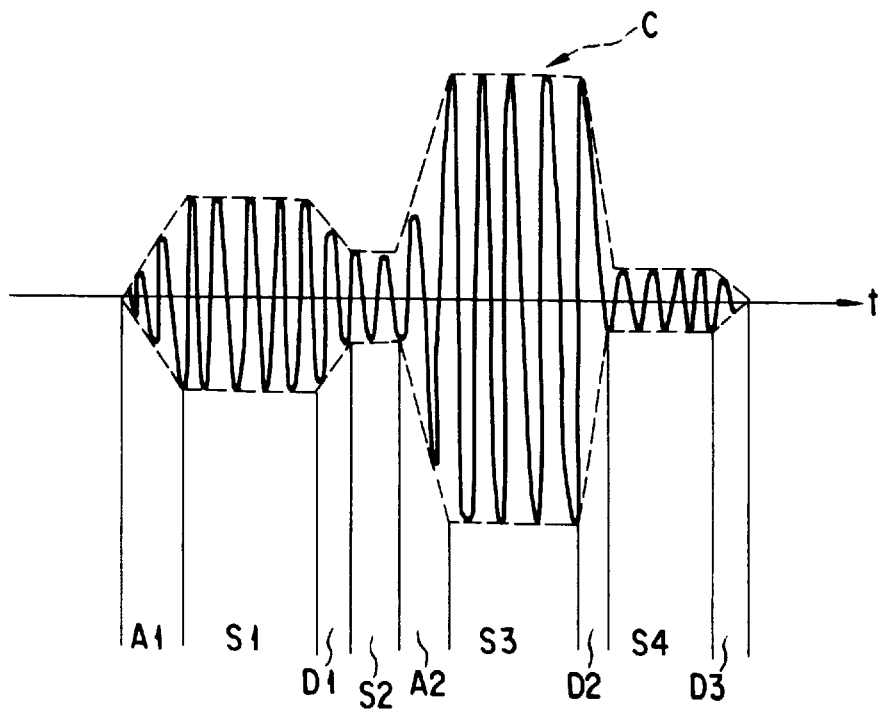
F I G. 16

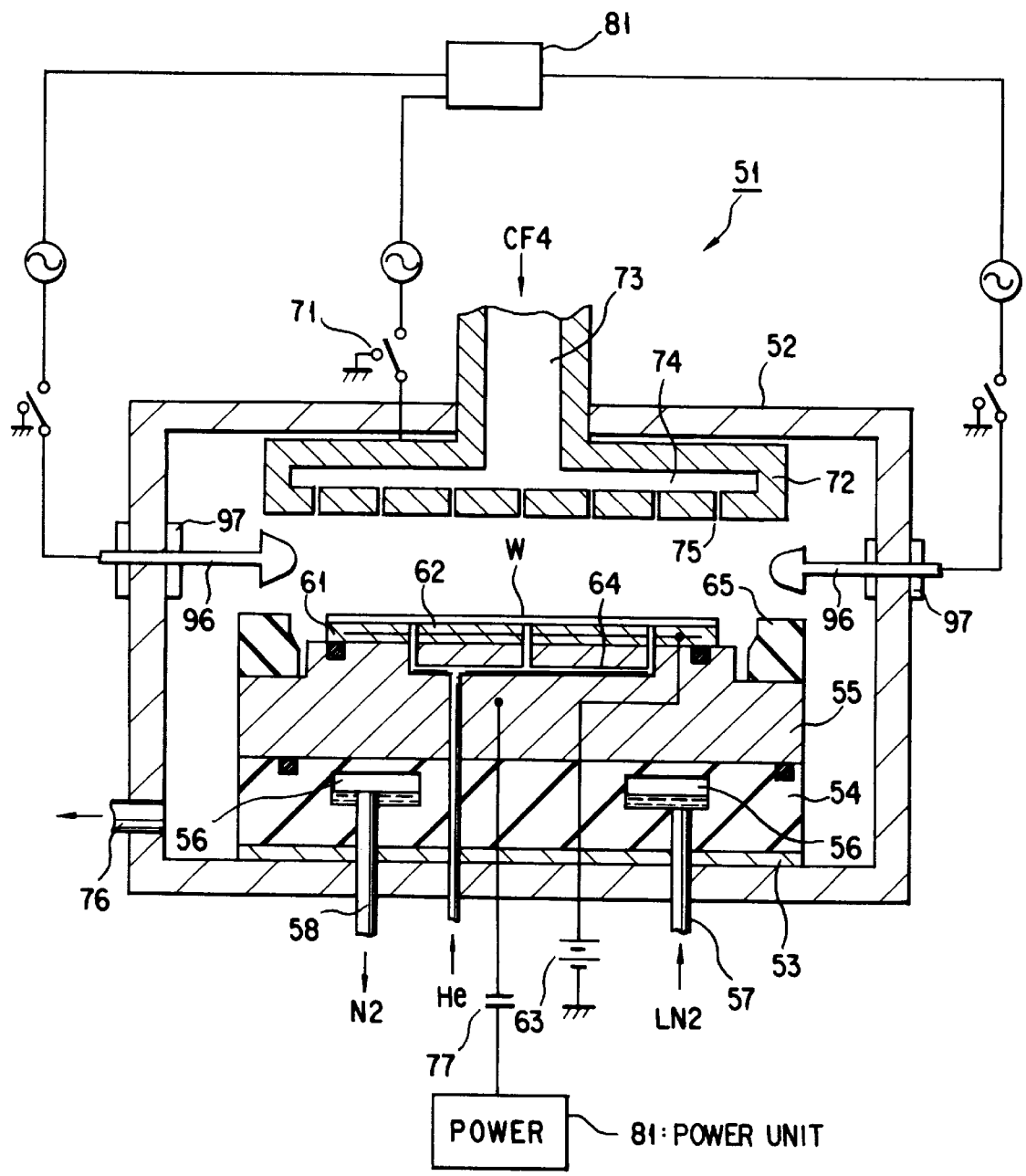
F I G. 17

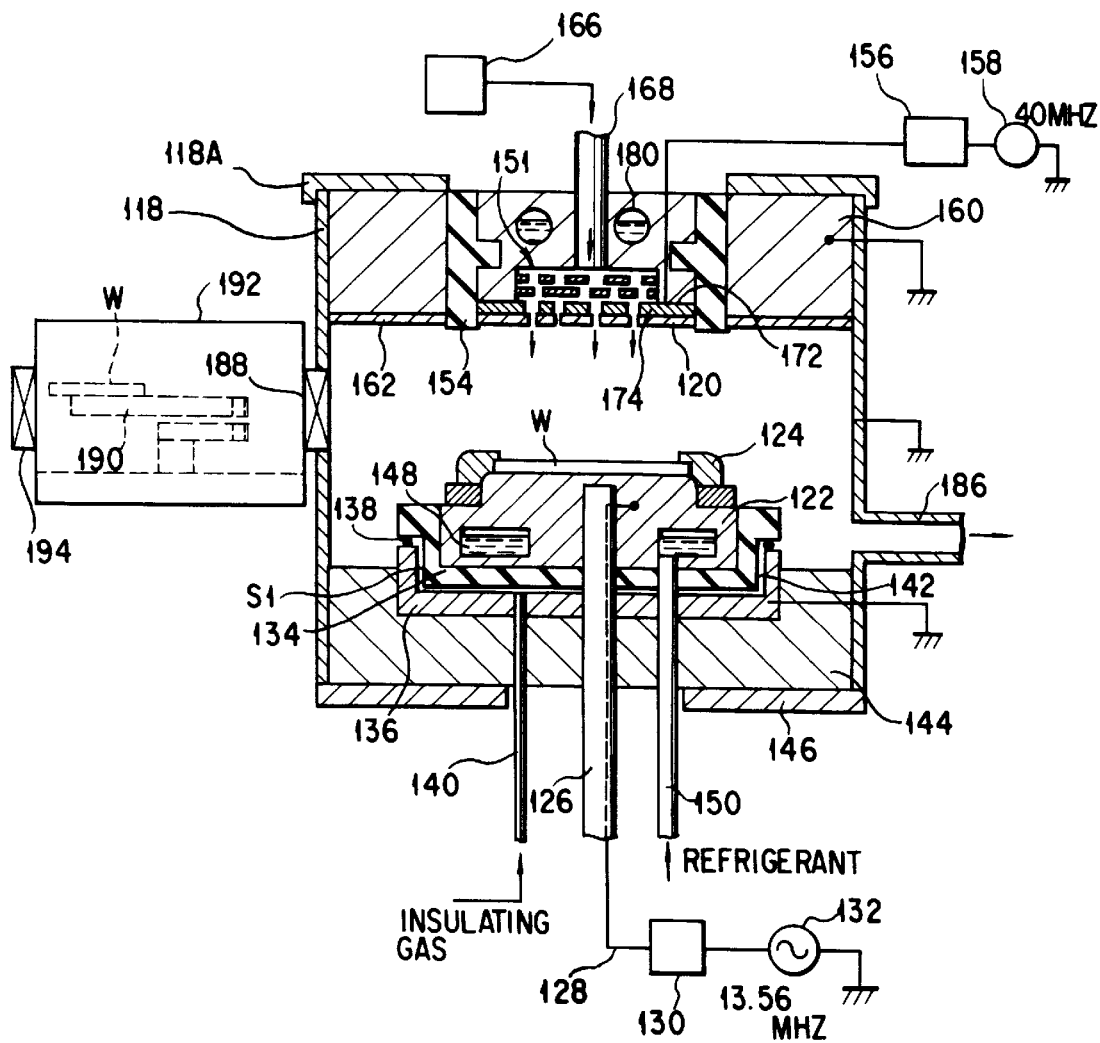
F I G. 18

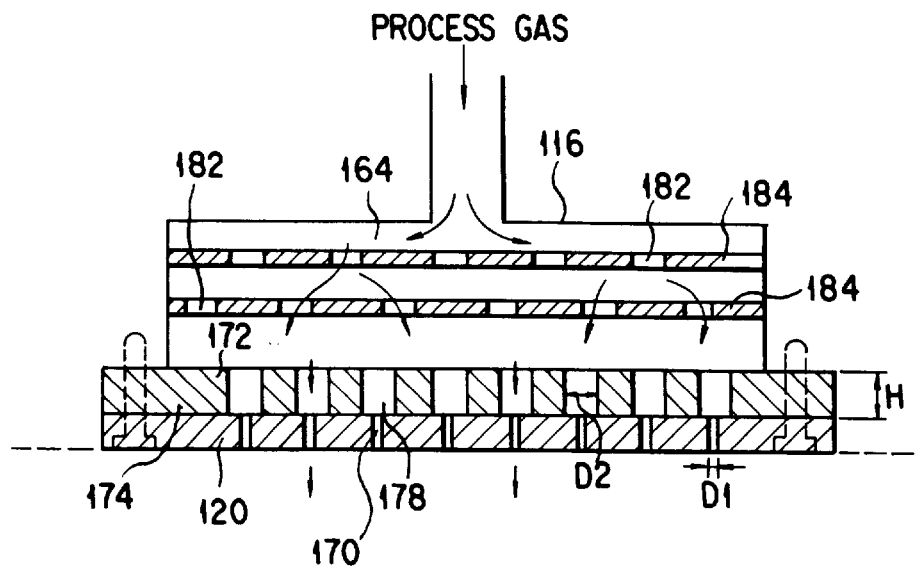
F I G. 19
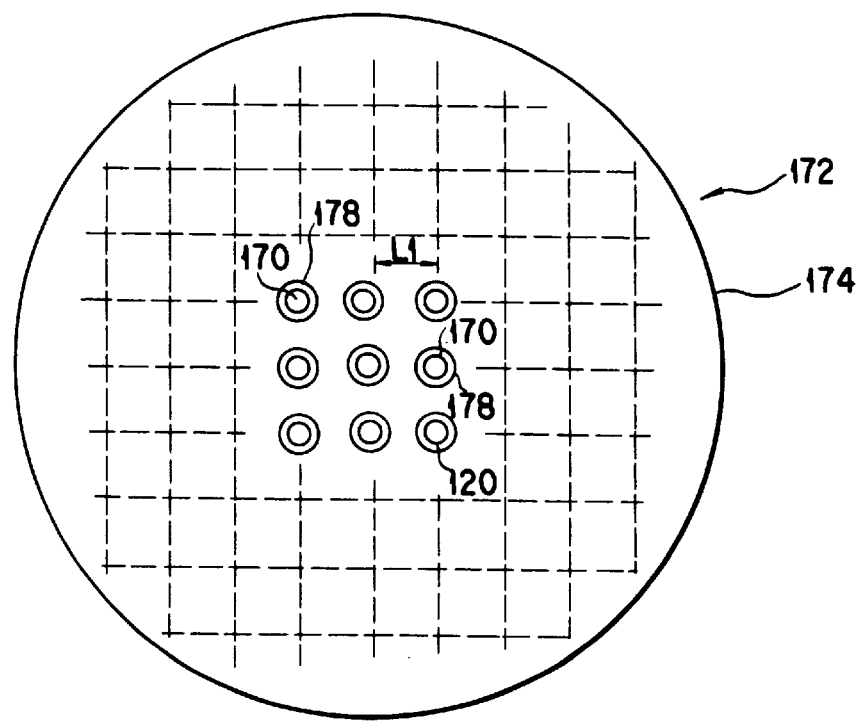
F I G. 20

PLASMA PROCESSING METHOD AND PLASMA PROCESSING APPARATUS

This application is a Continuation of application Ser. No. 08/220,683, filed on Mar. 31, 1994, now abandoned.

BACKGROUND OF THE INVENTION

1. Field of the Invention

The present invention relates to a plasma processing method and a plasma processing apparatus.

2. Description of the Related Art

In general, in a manufacturing step of a semiconductor device, a semiconductor wafer is subjected to a CVD process, an etching process, a sputtering process, etc. A plasma processing apparatus is used for these processes. For example, in a magnetron RIE apparatus which is an example of the plasma processing apparatus, a high-frequency electric power is applied to a processing chamber which is hermetically sealed, and a plasma is produced therein. In a plasma atmosphere, a semiconductor wafer, etc., which is an object to be processed mounted in the processing chamber, is subjected to an etching process. In this case, in order to increase a plasma density and enhance an etching rate, a high-frequency electric power of, e.g. 13.56 MHz is generally applied by an AC power supply.

However, in the above magnetron RIE apparatus, for example, if such a high-frequency power of a single frequency is applied, electrons with high mobility are non-uniformly accumulated on the surface of the semiconductor surface and a gradient of potential occurs. Consequently, the device may be destroyed by a charge-up. Thus, means for preventing the charge-up is required. Such means must prevent the charge-up without lowering the etching rate.

In addition, if the high-frequency power of the single frequency is applied and, for example, $CF_4$ gas is used as a processing gas to selectively etch away a silicon oxide film formed on a silicon substrate, the selection ratio decreases. The reason for this is that the density of the plasma is high and consequently the energy absorbed by the plasma increases and dissociation of gas molecules progresses greatly. Where the processing gas is $CF_4$, the dissociation progresses to the last phase, and most of radical components become F* (fluorine radical). Consequently, etching durability of a resist deteriorates considerably, resulting in a decrease of selection ratio. If the dissociation of gas molecules has progressed to the last phase, a great amount of C occurs and adheres to the surface of the silicon substrate. Moreover, where an AC high-frequency electric power having a single sine waveform is used, it is difficult to control dissociation of gas molecules.

For example, in the case where an etching process is performed as a plasma process, it is known that the lower the pressure (process pressure) of a gas atmosphere in the processing chamber, the more suitably the fine processing can be performed. For example, when a 4 MDRAM is formed, it is necessary to perform a fine process with a line width of about 0.8 $\mu$m. In this case, it is necessary to set the process pressure at about 1.7 Torr. Moreover, for example, when a 16 MDRAM is manufactured, it is necessary to perform fine processing with a line width of about 0.5 $\mu$m, and in this case the process pressure needs to be set at about 0.25 Torr.

Normally, when a processing gas is introduced into the processing chamber, the gas pressure in gas introducing means is made slightly higher than that in the processing chamber owing to a resistance applied by a gas introducing pipe, etc. However, if the process pressure decreases to about 0.25 Torr, as stated above, the gas pressure in the gas introducing means decreases considerably in accordance with the decrease of the process pressure. Thus, a plasma discharge occurs not only in the processing chamber but also in the gas introducing chamber. If the plasma discharge occurs in the gas introducing means, the material of the gas introducing means is hit with active species in the plasma and particles are produced. These particles flow into the processing chamber and adhere to the semiconductor wafer.

SUMMARY OF THE INVENTION

A first object of the present invention is to provide a plasma processing method capable of preventing a charge-up without lowering the plasma density in a plasma process.

A second object of the invention is to provide a plasma processing method capable of enhancing reliability of plasma processing by modulating a high-frequency electric power to be applied to a processing chamber, e.g. capable of increasing a selection ratio in selective etching.

A third object of the invention is to provide a plasma processing apparatus capable of curbing discharge in gas introducing means of a process gas.

The first object can be achieved by a plasma processing method in which a plasma is produced by a high-frequency power in a processing chamber in which an object to be processed is mounted, thereby producing a plasma in the processing chamber, and the object is processed in an atmosphere of the plasma, wherein the high-frequency power is subjected to modulation by a low-frequency power.

The second object can be achieved by a plasma processing method in which a plasma is produced in a processing chamber by using an electric power with a direction of current changed with passing of time, and an object to be processed, which is mounted in the processing chamber, is processed in an atmosphere of the plasma, wherein a power having a basic frequency is subjected to frequency modulation with a frequency equal to n-times (n=an integer) the basic frequency.

The third object can be achieved by a plasma processing apparatus in which while a process gas is supplied to a processing chamber via a first gas introducing hole formed in an electrode having gas introducing means, an object to be processed, which is held on an opposed electrode, is subjected to plasma processing, wherein resistance applying means is provided for applying resistance to the process gas flowing to the processing chamber via the gas introducing hole from the gas introducing means such that a plasma discharge is prevented from occurring under a condition of a process pressure less than 0.5 Torr in the processing chamber.

BRIEF DESCRIPTION OF THE DRAWINGS

FIG. 5 is a graph showing a relationship between a basic wave and an integer-number of times of spectra, on the one hand, and an amplification degree, on the other hand, in obtaining a sawtooth wave by frequency modulation with use of the power unit shown in FIG. 4;

FIG. 6 is a graph showing a waveform of the sawtooth wave obtained by frequency modulation on the basis of the relationship between the basic wave and integer-number of times of spectra, on the one hand, and the amplification degree, on the other hand, as shown in FIG. 5;

FIG. 7 is a graph showing a relationship between a basic wave and an integer-number of times of spectra, on the one hand, and an amplification degree, on the other hand, in obtaining a symmetric rectangular wave by frequency modulation with use of the power unit shown in FIG. 4;

FIG. 8 is a graph showing a waveform of the rectangular wave obtained by frequency modulation on the basis of the relationship between the basic wave and integer-number of times of spectra, on the one hand, and the amplification degree, on the other hand, as shown in FIG. 7;

FIG. 9 is a graph showing a relationship between a basic wave and an integer-number of times of spectra, on the one hand, and an amplification degree, on the other hand, in obtaining an asymmetric rectangular wave by frequency modulation with use of the power unit shown in FIG. 4;

FIG. 10 is a graph showing a waveform of the asymmetric rectangular wave obtained by frequency modulation on the basis of the relationship between the basic wave and integer-number of times of spectra, on the one hand, and the amplification degree, on the other hand, as shown in FIG. 9;

FIG. 11 is a graph showing a relationship between a basic wave and an integer-number of times of spectra, on the one hand, and an amplification degree, on the other hand, in obtaining a triangular wave by frequency modulation with use of the power unit shown in FIG. 4;

FIG. 12 is a graph showing a waveform of the triangular wave obtained by frequency modulation on the basis of the relationship between the basic wave and integer-number of times of spectra, on the one hand, and the amplification degree, on the other hand, as shown in FIG. 11;

FIG. 13 and FIG. 15 show schematically another example of the power unit used in the parallel flat-plate type RIE apparatus shown in FIG. 3;

FIG. 14 is a graph showing an output waveform obtained by frequency modulation with use of the power unit;

FIG. 16 is a graph showing an output waveform obtained by amplitude modulation with use of the power unit shown in FIG. 15;

FIG. 17 shows schematically a parallel flat-plate type RIE apparatus used for carrying out a plasma processing method according to another embodiment of the invention;

FIG. 18 shows schematically an embodiment of a plasma processing apparatus according to the present invention;

FIG. 19 is an enlarged cross-sectional view showing a region including an upper electrode of the plasma processing apparatus shown in FIG. 18; and FIG. 20 is a plan view showing resistance applying means shown in FIG. 19.

DETAILED DESCRIPTION OF THE PREFERRED EMBODIMENTS

Figure 1:
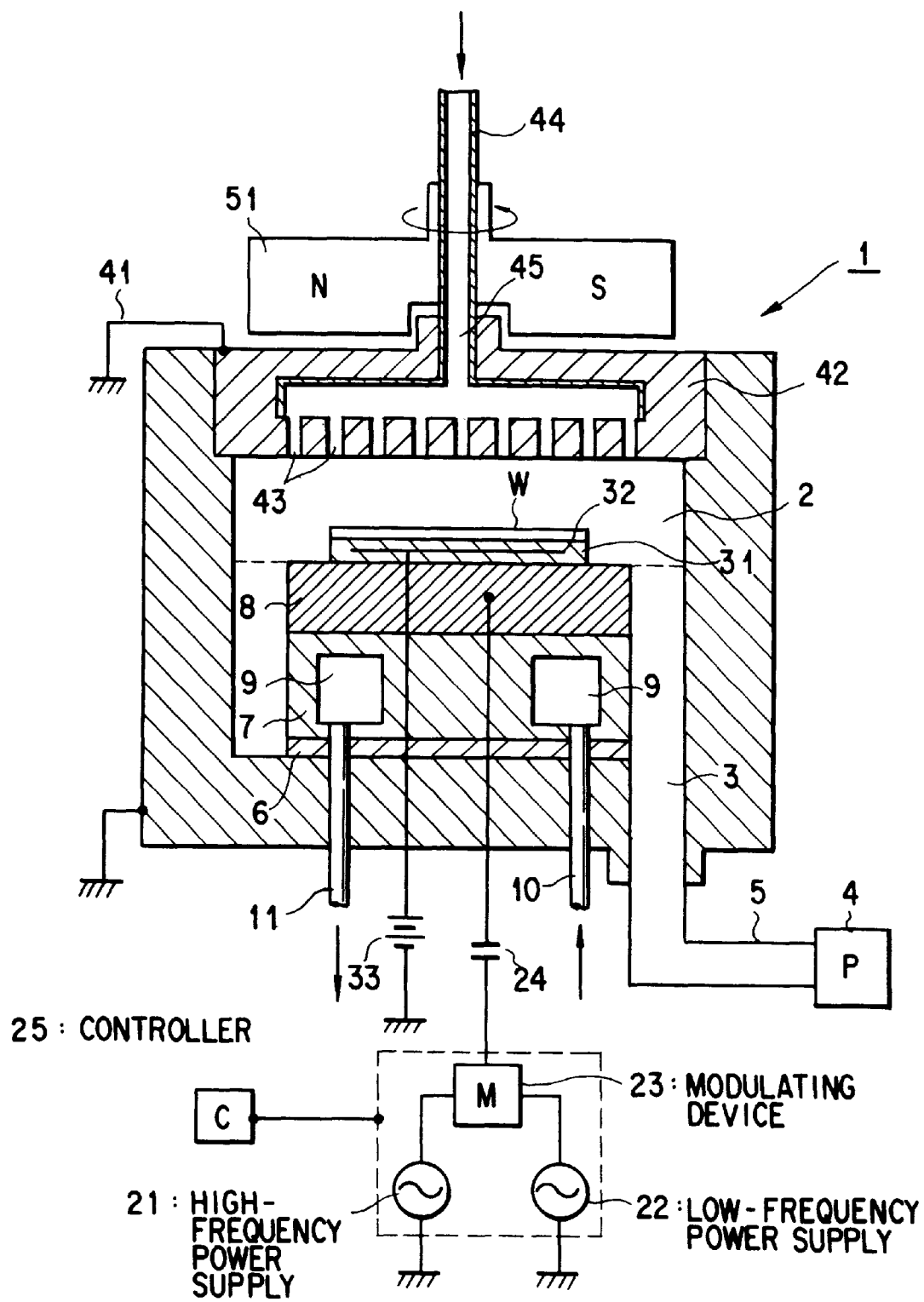
FIG. 1 shows schematically a magnetron RIE apparatus used for carrying out a plasma processing method according to an embodiment of the present invention.

A charge-up occurring in an object such as a semiconductor wafer in a plasma process is due to the fact that only electrons with high mobility are moved by application of high-frequency electric power and charging is effected. The inventors found that the charge-up can be prevented by moving ions onto the object by application of low-frequency electric power and neutralizing the electrons charged on the object. However, if the high-frequency electric power is simply changed to the low-frequency electric power, the plasma density decreases and the etching rate, too, decreases, resulting in a problem in a practical level. Accordingly, in the present invention, the above problem is solved by partly modulating a high-frequency electric power by means of a low-frequency electric power so as not to lower the etching rate. In the present invention, the "high-frequency" power refers to frequencies of 10 MHz or more having high plasma dissociation efficiency, and the "low-frequency" power refers to frequencies of less than 10 MHz for the purpose of convenience. It is desirable, however, that the frequency of the low-frequency power to be applied by the aforementioned modulation be 3 MHz or less, and preferably 2 MHz or less. Specifically, movement of ions and electrons in the plasma is effected by a variation of an AC electric field. According to a first aspect of the present invention, a low-frequency power, to which ions of large mass can follow, is applied partly to a high-frequency power with high plasma dissociation efficiency, and the high-frequency power is modulated. Thereby, the charge on the object to be processed is neutralized by movement of ions without lowering the plasma density.

In a second aspect of the present invention, the following function is taken into account. Specifically, the movement of ions in a generated plasma, in particular, the incidence of ions on the object, which directly influences the processing such as etching, varies in its mode depending on the waveform of an electric signal functioning as an energy source. For example, in the normal sine wave, the acceleration of ions is not constant and, because of this, the control of dissociation-phase molecules of the processing gas introduced into the processing chamber is difficult.

On the other hand, in the case of a pulse wave from which a constant output is obtained for a constant time period at regular intervals, dissociation does not progress at a flat portion of the waveform thereof. Thus, the dissociation phase can be controlled by controlling, for example, the pulse width. Moreover, in the case of a sawtooth wave, a triangular wave and a ramp wave having falling portions with constant gradients, the acceleration of ions is constant and the ion bombardment of etchant ions can be increased. As a result, the etching rate can be increased.

In a third aspect of the present invention, a processing gas is introduced into a processing chamber from gas introducing means via a gas introducing hole in the state in which a pressure is controlled by resistance applying means. In this case, even if the process gas pressure in the processing chamber is set at 0.5 Torr or less for performing fine processing, the pressure in the gas introducing means is slightly higher than 0.5 Torr due to resistance by the resistance applying means, and the inside state of the gas introducing means does not agree with a law of Paschen which represents the condition for causing a plasma discharge. Thus, the generation of plasma in the gas introducing means is curbed.

Embodiments of the present invention will now be described with reference to the accompanying drawings.
(Embodiment 1)

FIG. 1 shows schematically a magnetron RIE apparatus 1 used in working an embodiment of plasma processing method according to the first aspect of the invention. The magnetron RIE apparatus 1 has a hermetically sealed processing chamber 2 which is made of aluminum, etc. and is electrically grounded. An exhaust port 3 provided at a bottom portion of the processing chamber 2 is connected to an exhaust pipe 5 communicating with exhaust means 4 such as a vacuum pump. A vacuum is created in the processing chamber 2 by the exhaust means 4 uniformly from a bottom region of the processing chamber 2, and the pressure in the chamber 2 is set and maintained at a predetermined negative pressure in the range of, e.g. several mTorr to several-ten Torr.

A susceptor support table 7 is provided on a center bottom portion in the processing chamber 2 with an insulating plate 6 of ceramics, etc. interposed. A susceptor 8 made of aluminum, etc. and constituting a lower electrode is provided on the upper surface of the susceptor support table 7. A refrigerant chamber 9 is defined within the susceptor support table 7. A refrigerant for temperature control is introduced into the refrigerant chamber 9 through a refrigerant introducing pipe 10 provided at the bottom portion of the processing chamber 2. The refrigerant is exhausted from a refrigerant discharge pipe 11 and thus circulated. In this manner, the susceptor 8 is controlled at a desired temperature.

A high-frequency power supply 21 and a low-frequency power supply 22 are provided on the outside of the processing chamber 2. The high-frequency power supply 21 is designed to output a high-frequency power of 10 MHz or above, e.g. 13.56 MHz. The low-frequency power supply 22 is designed to output a low-frequency power of 100 kHz to 3 MHz, e.g. 2 MHz. Electric power output from the high-frequency power supply 21 and low-frequency power supply 22 is once input to a modulating device 23. The modulating device 23 modulates the frequency of input power and then the modulated power is applied to the susceptor 8 via a blocking capacitor 24.

The high-frequency power supply 21, low-frequency power supply 22 and modulating device 23 are controlled by a controller 25. For example, in the normal state, the controller 25 functions to apply only the high-frequency power from the high-frequency power supply 21 to the susceptor 8, and apply the low-frequency power from the low-frequency power supply 22 to the high-frequency power from the high-frequency power supply 21 for a predetermined time period at regular intervals, thereby effecting frequency modulation.

A semiconductor wafer W or an object to be processed is directly placed on the upper surface of the susceptor 8 and is attracted and held by an electrostatic chuck 31. The electrostatic chuck 31 is constructed such that a conductive layer 32 made of, e.g. an electrolytic copper foil is sandwiched by, and adhered to, insulative members such polyimide films vertically. When a DC voltage is applied to the conductive layer 32 by a high-voltage DC power supply 33 provided on the outside of the processing chamber 2, the semiconductor wafer W is attracted and held by the electrostatic chuck 31 by Coulomb force.

On the other hand, an upper electrode 42 is provided at an upper portion in the processing chamber 2, and the upper electrode 42 is electrically grounded via a ground line 41. The upper electrode 42 is made of aluminum, etc. subjected to surface-treatment using, e.g. amorphous carbon or SiC. The upper electrode 42 is hollow. A number of gas diffusion holes 43 are formed on that surface of the upper electrode 42, which face the semiconductor wafer W.

A gas introducing port 45 communicating with a gas introducing pipe 44 is provided at an upper center portion of the upper electrode 42. A processing gas such an etching gas supplied from the gas introducing pipe 44 is uniformly discharged to the semiconductor wafer W from the gas introducing port 45 through said number of gas diffusion holes 43. A permanent magnet 51 is situated immediately above the upper surface of the upper electrode 42. The permanent magnet 51 is rotatable on the gas introducing pipe 44 at a desired speed by a driving mechanism (not shown) such as a motor. The permanent magnet 51 can apply a substantially uniform, parallel magnetic field, e.g. a magnetic field of a given value in a range of 10 to 1000 G, to the surface of the semiconductor wafer W placed on the electrostatic chuck 31.

The etching process for the semiconductor wafer W by use of the magnetron RIE apparatus 1 having the above structure will now be described. The semiconductor wafer W or the object to be processed is put in the processing chamber 2 from a load lock chamber (not shown) coupled to the magnetron RIE apparatus 1 via a gate valve (not shown). The semiconductor wafer w is placed on the electrostatic chuck 31. By applying power from the high-voltage DC power supply 33, the semiconductor wafer W is attracted and held on the electrostatic chuck 31.

Then, the inside of the processing chamber 2 is exhausted by the exhaust means 4, while the processing gas, e.g. $CF_4$ gas, is supplied into the processing chamber 2 from the gas introducing port 45. Thus, the pressure in the processing chamber 2 is set and maintained at, e.g. 10 mTorr. Then, the permanent magnet 51 is rotated to apply a magnetic field so that a magnetic field of, e.g. 100 G is produced in the vicinity of the center of the semiconductor wafer W. On the other hand, by a command from the controller 25, a high-frequency electric power of 13.56 MHz is applied from the high-frequency power supply to the susceptor 8. As a result, a plasma is generated in the processing chamber 2, and anisotropy etching by reactive ions accelerated by a sheath layer is effected on the semiconductor wafer W.

Figure 2:
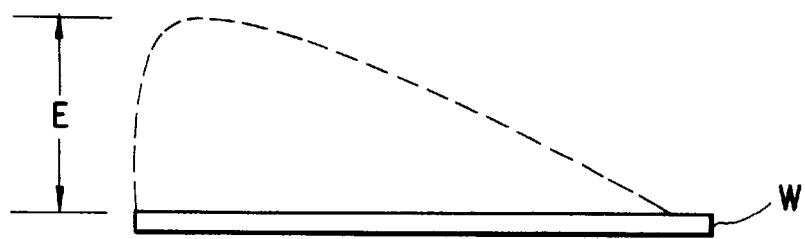
FIG. 2 illustrates the state in which a semiconductor wafer has been charged up.

In this plasma process, while the etching with high frequency of 13.56 MHz is being performed, a gradient in potential occurs on the semiconductor wafer W, as shown in FIG. 2. If the application of high-frequency power of 13.56 MHz is continued, the device may be destroyed at last owing to the charge-up. In order to prevent the charge-up, the controller 25 makes the modulating device 24 apply a low-frequency power of, e.g. 2 MHz from the low-frequency power supply 22 to the high-frequency power of 13.56 MHz from the high-frequency power supply 21, thereby effecting frequency modulation.

In this case, it is desirable that the modulation be effected, for example, at the time the charge voltage ("E" in FIG. 2) on the semiconductor wafer W has reached 10 V or thereabouts, and preferably 5 V. In many cases, device destruction due to this kind of charge-up occurs at 10 V or above. Needless to say, however, this voltage varies depending on the structure of the device. Accordingly, if the above-mentioned modulation due to low-frequency power of 2 MHz is effected at the preceding stage, neutralization due to movement of ions is performed and the charge on the semiconductor wafer W is canceled, and thus the destruction due to the charge-up is prevented. Determination as to whether or not the charge voltage on the semiconductor wafer W has reached 10 V or 5 V may be performed such that a dummy wafer is etched under the same condition, the charge voltage on the dummy wafer is measured, data on the time at which the charge voltage has reached 10 V or 5 V is recorded, and the recorded data is stored in the controller 25. Based on the data, the modulation may be effected.

After the modulation is effected for a predetermined time period, the modulation is stopped and the etching is continued by application of the high-frequency power of 13.56 MHz from the high-frequency power supply 21. These control operations are performed by the controller 25. If the charge voltage reaches 10 V or 5 V until the completion of the etching, as mentioned above, the modulation by the modulating apparatus 23 may be repeated. Thereby, device destruction due to the charge-up of the semiconductor wafer W or the object to be processed is prevented. In addition, only when the charge voltage has reached 10 V, can the modulation with low-frequency power be performed. Thus, the plasma density does little lower and the etching rate does not decrease.

In this embodiment, two power supplies, high-frequency power supply 21 and low-frequency power supply 22, are used. However, in the case of frequency modulation, one power supply device may be used and switching between high frequency and low frequency may be effected, for example, by the controller 25. The modulating device 23 in this embodiment is designed to perform frequency modulation. However, a modulating device for performing amplitude modulation may be used to effect amplitude modulation with the same advantage. Moreover, in the present embodiment, the magnetron RIE apparatus is employed, but this invention is applicable to plasma processing in various types of plasma processing apparatuses wherein charge-up may occur on the object to be processed in plasma processing.

(Embodiment 2)

Figure 3:
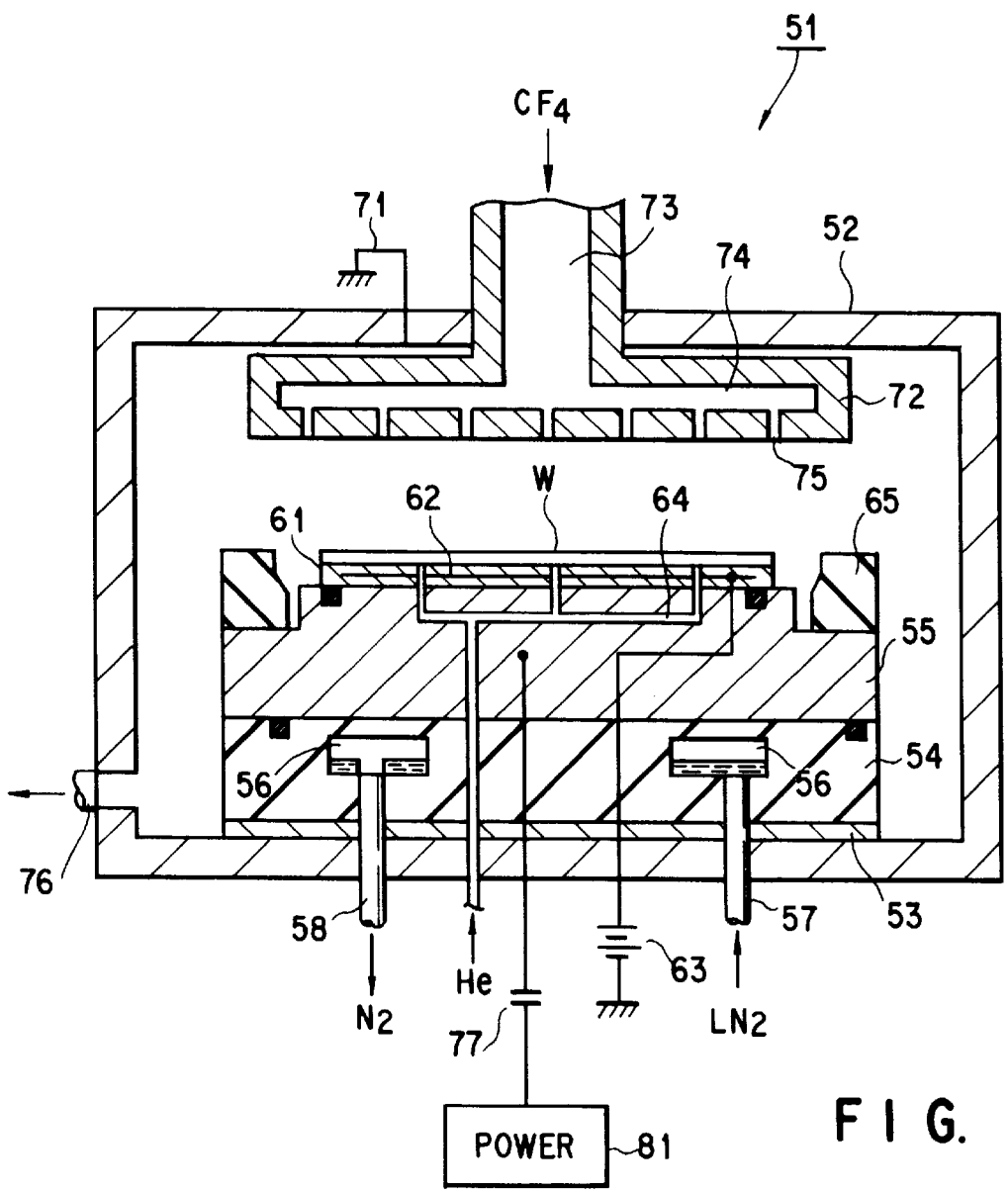
FIG. 3 shows schematically a parallel flat-plate type RIE apparatus used for carrying out a plasma processing method according to another embodiment of the invention.

FIG. 3 shows schematically a plasma etching apparatus 51 used in working an embodiment of a plasma processing method according to a second aspect of the present invention. This plasma etching apparatus 51 differs from the magnetron RIE apparatus 1 shown in FIG. 1, in that the former is constructed as a so-called parallel flat-plate type RIE apparatus.

The plasma etching apparatus 51, like magnetron RIE apparatus 1, has a cylindrical or rectangular processing chamber 52 made of aluminum, etc. the surface of which is subjected to alumite treatment. A substantially cylindrical susceptor support table 54 is situated at a bottom portion of the processing chamber 52. The susceptor support table 54 supports an object to be processed, e.g. a semiconductor wafer W, with an insulative plate 3 of ceramics, etc. interposed. Moreover, a susceptor 55 constituting a lower electrode is provided on the susceptor support table 54.

A refrigerant chamber 56 is provided within the susceptor support table 54. A temperature-controlling refrigerant such as liquid nitrogen ($LN_2$) can be introduced into the refrigerant chamber 56 via a refrigerant introducing pipe 57. The introduced refrigerant transmits cool heat to the semiconductor wafer W via the susceptor 55 and cools the surface to be processed of the semiconductor wafer W to a desired temperature. At this time, the liquid nitrogen, which has transmitted cool heat, changes to nitrogen gas by nuclear boiling. The nitrogen gas is exhausted to the outside of the processing chamber 52 through a refrigerant exhaust pipe 58.

The susceptor 55 has a disc-like top projecting portion, and a center portion of the top projecting portion is provided with an electrostatic chuck 61 having substantially the same shape as the semiconductor wafer W or object to be processed, as with the magnetron RIE apparatus 1 shown in FIG. 1. This electrostatic chuck 61 has two polyimide films and a conductive layer 62 interposed therebetween. A DC high voltage of, e.g. 1.5 kv is applied to the conductive layer 62 from a DC high voltage power supply 63 provided outside the processing chamber 52. Thus, the semiconductor wafer W placed on the upper surface of the electrostatic chuck 62 is attracted and held in this position.

A gas passage 64 for supplying a heat transmission gas such as HE to the bottom surface of the semiconductor wafer W is formed to penetrate the susceptor support table 54, susceptor 55 and electrostatic chuck 61. Thereby, the temperature of the semiconductor wafer W or object to be processed can be set and maintained at a predetermined processing temperature. An annular focus ring 65 is provided at an upper peripheral portion of the susceptor 55 so as to surround the semiconductor wafer W placed on the electrostatic chuck 61. The focus ring 65 is made of an insulating material which does not attract reactive ions. The focus ring 65 causes reactive ions generated by plasma to be efficiently incident on the semiconductor wafer W alone situated inside the focus ring 65.

An upper electrode 72 is provided above the susceptor 55 with a distance of about 15 to 20 mm such that both face each other in parallel. The upper electrode 72 is grounded by a ground line 71. A processing gas such as $CF_4$ is uniformly discharged to the semiconductor wafer W from gas diffusion holes 75 via a gas introducing pipe 73 situated at the center of the upper electrode 72 and a hollow portion 74.

An exhaust pipe 76 is connected to a lower side wall portion of the processing chamber 52 and thereby the inside of the processing chamber 52 can be evacuated by exhaust means (not shown) such as a turbo molecule pump. Besides, an openable gate valve (not shown) is provided at a center portion of the side wall. The semiconductor wafer W or object to be processed is put in and taken out by transfer means (not shown) such as a transfer arm through the gate valve. The susceptor 55 can be supplied with power from a power unit 81 via a blocking capacitor 77.

Figure 4:
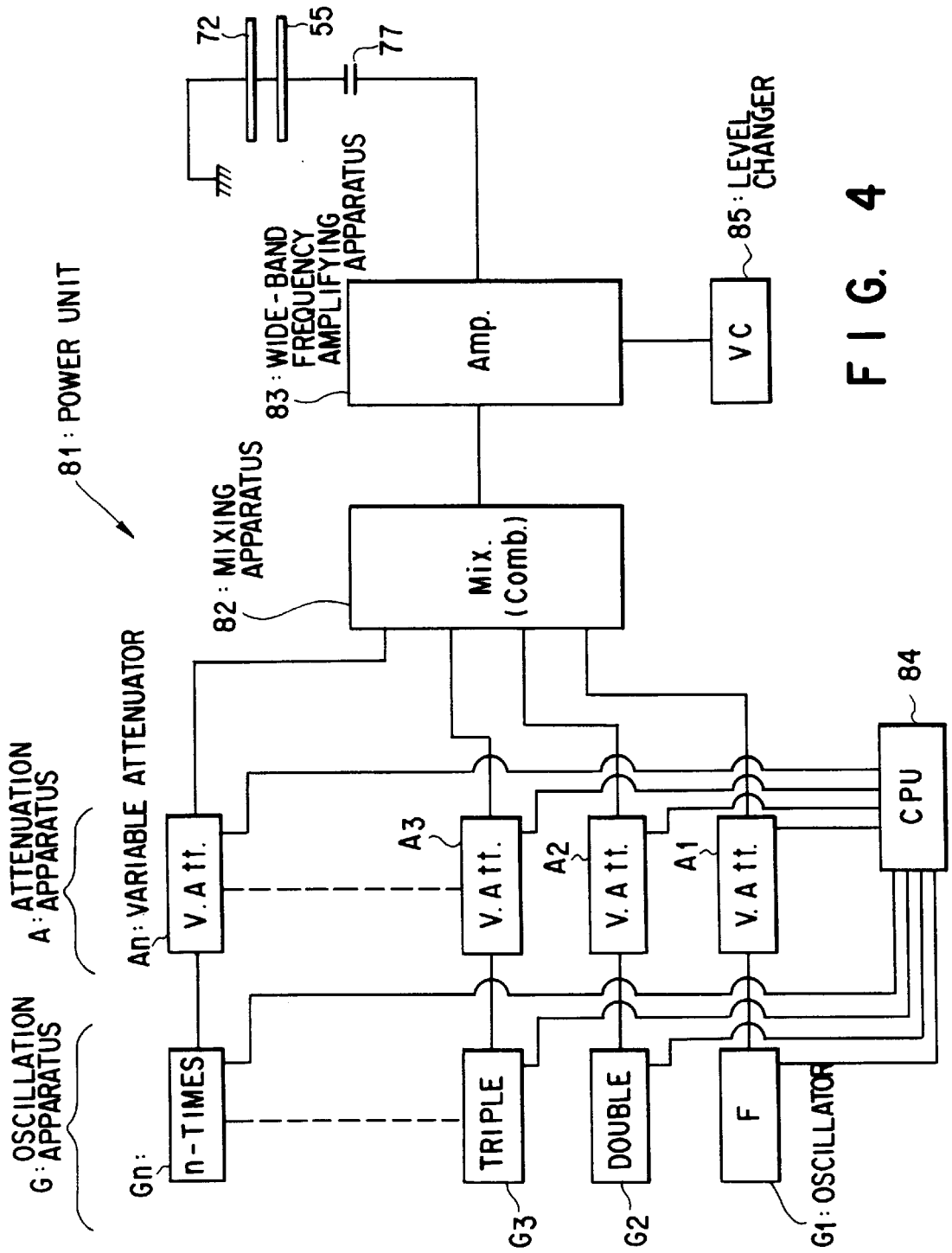
FIG. 4 shows schematically an example of a power unit used in the parallel flat-plate type RIE apparatus shown in FIG. 3.

As is shown in FIG. 4, the power unit 81 comprises an oscillation apparatus constituted by a basic wave oscillator $G_1$ for oscillating a basic wave, e.g. a sine wave with frequency of 380 kHz, and a plurality of oscillators $G_2$ to $G_n$ for oscillating sine waves with frequencies equal to an integer-number of times of the frequency of the basic wave; an attenuation apparatus A consisting of variable attenuators $A_1$ to $A_n$ associated with the oscillators $G_1$ to $G_n$; a mixing apparatus (or combining apparatus) 82 for mixing output signals from the variable attenuators $A_1$ to $A_n$ of attenuation apparatus A; and a wide-band frequency amplifying apparatus 83 for amplifying an output signal from the mixing apparatus 82.

The oscillators $G_1$ to $G_n$ and variable attenuators $A_1$ to $A_n$ are controlled by a central controller 84. Two or more of the oscillators $G_1$ to $G_n$ are voluntarily combined and operated. Furthermore, the attenuation degree of each operated oscillator is individually adjusted. Each output signal of these is input to the mixing apparatus 82. The signals input to the mixing apparatus 82 from the variable attenuators $A_1$ to $A_n$ are synthesized and amplified by the wide-band frequency amplifying apparatus. The amplified signal is applied to the susceptor 55 in the processing chamber 52 as power for generating a plasma. The wide-band frequency amplifying apparatus 83 is separately provided with a level changer 85 for voluntarily adjusting the level of waveform applied to the susceptor 55.

The etching process for the semiconductor wafer W by use of the plasma etching apparatus 51 having the above structure will now be described. In the case of the plasma etching apparatus 51, too, the basic operation for transferring the object or semiconductor wafer W into the processing chamber 52 is the same as with the case of the magnetron RIE apparatus 1 shown in FIG. 1. At first, the semiconductor wafer W is entered into the processing chamber 52 from the load lock chamber (not shown) provided via the gate valve (not shown), and the wafer W is placed on the electrostatic chuck 61. Thereafter, power is applied from the high-voltage DC power supply 63 so that the semiconductor wafer W is attracted and held by the electrostatic chuck 61.

Then, the processing chamber 52 is evacuated by the exhaust means, while the processing gas such as $CF_4$ gas is supplied into the processing chamber 52 from the gas diffusion holes 75. The pressure in the processing chamber 52 is set and maintained at, e.g. 10 mTorr. A predetermined power is applied to the susceptor 55 from the power unit 81 to generate a plasma between the upper electrode 72 and the susceptor 55, and $CF_4$ gas is dissociated. The semiconductor wafer W or object to be processed is subjected to a predetermined etching process. Since the power unit 81 has a structure as shown in FIG. 4, the power to be applied is frequency-modulated, and a waveform most suitable for each etching process is produced. Thus, the dissociation of gas molecules of the processing gas can be controlled.

For example, the etching of a silicon oxide film using $CF_4$ for forming a contact hole in a surface portion of the semiconductor wafer W will now be described. The $CF_4$ gas molecules excited by the plasma undergo multiple-phase dissociation in the plasma, as shown below:

Specifically, $CF_4$ is dissociated in the following manner:

$.CF_3+F^-$
$CF_3^-+.F$
$CF_3^++F^-$
$CF_3^++.F+e^-$ and $F^-$ changes to "$F^- \rightarrow F^*+e^-$". This $F^*$ (fluorine radical) effects etching on $SiO_2$ of the surface of the semiconductor wafer W.

In this case, if a conventional high-density plasma created by a single sine wave is used, the dissociation progresses to the last phase and fluorine radicals are produced excessively. Consequently, F is mixed in a protection polymer (resist) and etching durability is degraded. Consequently, the selection ratio of the oxide film to Si decreases. On the other hand, according to the power unit 81 of the plasma etching apparatus 51, the waveform of power applied to the susceptor 55 can be freely chosen by frequency modulation and an optimal output wave can be obtained according to the purpose.

For example, the basic wave F (e.g. 380 kHz) is oscillated from the oscillator $G_1$. Waves of frequencies equal to an integer-number of times of the frequency of basic wave F, e.g. double frequency wave (760 kHz), triple frequency wave (1140 kHz), four-fold wave (1520 kHz) . . . are oscillated from the oscillator $G_2$ and the other oscillators. As shown in FIG. 5, for example, the phase of an output having an even-number of times of frequency is displaced by 180°, and the phase of an output having an odd-number of times of frequency is unchanged. These outputs are adjusted by the variable attenuators $A_1$ to $A_n$ and mixed by the mixing apparatus 82. Thus, a sawtooth wave as shown in FIG. 6 can be obtained.

If the sawtooth wave is applied to the susceptor 55 of the processing chamber 52, ion bombardment of etchant ions can be intensified and the etching rate can be enhanced. The waveform control can be effected by the central controller 84 and peripheral device(s) (not shown). Furthermore, as shown in FIG. 7, the oscillator $G_1$ and oscillators $G_3$, $G_5$, $G_7$ . . . may be operated and only waves with an odd-number of times of the frequency of the basic wave may be oscillated and synthesized. Thereby, a rectangular wave as shown in FIG. 8 can be obtained. This rectangular wave is applied to the susceptor 55 to produce a plasma, and a pulse width thereof is controlled. Thereby, dissociation of $CF_4$ gas or reaction gas is controlled.

For example, by setting the pulse width at 10 $\mu$sec or less, the dissociation of $CF_4$ gas molecules can be curbed to the second phase, $CF_3^-+.F$.

Although excessive generation of fluorine radicals is curbed, the etching durability of protection polymers is not degraded and the dissociation does not progress. Accordingly, generation of deposited C (carbon) which stops etching can be curbed, and the etching process with high selection ratio can be effected.

Furthermore, as is shown in FIG. 9, as to the waves equal to double, 7 times and 8 times the basic wave, the outputs thereof are suitably adjusted by the variable attenuators $A_2$, $A_7$ and $A_8$ with their phases unchanged. As to the waves equal to four times and five times the basic wave F, if each phase is displaced by 180° and each output is adjusted by the variable attenuators $A_4$ and $A_5$ and then these outputs are synthesized, an asymmetric pulse wave with a small pulse width can be obtained, as shown in FIG. 10. Since the wide-band frequency amplifying apparatus 83 is provided with the level changer 85 in the power unit 81, such an asymmetric pulse wave can be obtained by the operation of the level changer 85.

Besides, as is shown in FIG. 11, only the waves with the odd-number of times of the basic wave may be oscillated and alternately displaced in phase by 180° for effecting frequency modulation. Thereby, as shown in FIG. 12, a triangular wave with the same time of rising and falling portions can be obtained. With the triangular wave, etchant ions can always be made incident at a constant acceleration. Needless to say, other waveforms can be produced by the control operation of the central controller 84, in addition to the above waveforms.

As described above, by suitably combining the waves equal to an integer-number of times of the basic wave to effect frequency modulation, the intensity of ion bombardment can be controlled in accordance with the kind and mass of etchant ions of various kinds of reactive gases as well as conventional $CF_4$ gas molecules and moreover the dissociation of gas molecules can be controlled. Thereby, the etching rate can be increased, and the etching processing with a high selection ratio can be performed.

In order to obtain a desired waveform by the above frequency modulation, it should suffice if the waves equal generally to 7 to 9 times the basic wave are produced. Thus, there is no problem in practical level if the power unit 81 is provided with such a number of oscillators and associated variable attenuators as the oscillators $G_1$ to $G_{10}$ and variable attenuators $A_1$ to $A_{10}$. With this structure, less power is required in comparison to the basic wave, and retro-fit modification is suitably made with less costs. Of course, since acceleration of etchant ions can be controlled, the charge-up on the semiconductor wafer W as described above in connection with the Embodiment 1 can be prevented.

In the power unit 81, for example, a voltage control filter or a notch filter may be interposed between the mixing apparatus 82 and wide-band frequency amplifying apparatus 83, thereby to modulate cut-off frequency of the filter. In this case, the etchant generation efficiency and the ratio of ions drawing to the table (lower electrode) can be made variable.

Moreover, as a mechanism for forcibly varying the entire DC bias, for example, a DC stabilizing power supply in which a high-frequency wave component is cut may be provided on either the upper application mechanism or lower application mechanism or on both of them. In this case, the etchant may be converged onto the semiconductor wafer W or dissipated.

In the power unit 81, the waves equal to an integer-number of times of the basic wave are oscillated and these waves are suitably combined to effect frequency modulation. The power unit 81 having this structure may be replaced by a power unit 91 as shown in FIG. 13. This power unit 91 comprises plural, e.g. four oscillators $K_1$ to $K_4$ having industrial frequencies or frequencies meeting the Wireless Telegraphy Act. For example, the oscillator $K_1$ is designed to output a sine wave of 380 kHz, the oscillator $K_2$ is designed to output a sine wave of 13.56 MHz, the oscillator $K_3$ is designed to output a sine wave of 27.12 MHz, and the oscillator $K_4$ is designed to output a sine wave of 40.68 MHz. The outputs of the oscillators $K_1$ to $K_4$ are input to associated timing gates $T_1$ to $T_4$. These timing gates $T_1$ to $T_4$ are opened/closed by a central controller 92 so that only one of the timing gates is opened. The central controller 92 is provided with a phase corrector 93 for correcting phases of waveforms when the waveforms are changed by the opening/closing of the timing gates $T_1$ to $T_4$ and thereby changing these waveforms into a continuous wave. Output signals obtained by the opening/closing of the timing gates $T_1$ to $T_4$ are combined into a single continuous wave by a mixing apparatus (or combining apparatus) 94 for mixing the output signals. The continuous wave is supplied to the susceptor 55 in the processing chamber 52 via an amplifying apparatus 95 and blocking capacitor 77.

By using the power unit 91 with the above structure, a power with an output waveform, for example, as shown in FIG. 14, can be applied to the susceptor 55. Specifically, the waveform itself shown in FIG. 14 is that of a sine wave, but the frequency thereof varies, for example, in every half cycle or every cycle, and top and bottom points of the frequency are attained in every cycle. With this output waveform, the incident energy of, e.g. etchant ions can be controlled very finely, and higher-level control of etching characteristics can be attained.

It is possible that the frequency modulation is performed in units of, e.g. one second or two seconds. However, as described above, the time for the modulation in this order is much greater than the dissociation time of reactive gas and a decrease in etching rate is inevitable. However, by modulating the frequency in units of a cycle, as mentioned above, the incidence energy of etchant ions can be controlled without progressing the dissociation reaction. Thus, the ion bombardment can be adjusted and the etching rate can be increased. Accordingly, an etching process with high anisotropy can be performed. Moreover, as shown in the graph of FIG. 14, an interval P may be set and application of power can be stopped, thereby achieving finer control. Besides, the mixing apparatus 94 may be connected to the upper electrode 72, as shown in FIG. 13, with the same control operation as above.

The power unit 81 or 91 may be replaced by a power unit 101 shown in FIG. 15. The power unit 101 has a structure for performing amplitude modulation. The power unit 101 comprises a high-frequency power supply 102 for oscillating a frequency of, e.g. 13.56 MHz, a variable attenuator 103 for attenuating the amplitude of the output waveform of the high-frequency power supply 102, an amplifier 104 for amplifying the output from the variable attenuator 103, and a matching device 105. A predetermined high-frequency power is applied to the susceptor 55 in the processing chamber 52 via the matching device 105. If a plasma is produced between the upper electrode 72 and susceptor 55 by performing amplitude modulation shown in, e.g. FIG. 16 by using the power unit 101, the following plasma control can be performed.

In the amplitude modulation shown in FIG. 16, a carrier wave (indicated by a broken line in FIG. 16) C which is called "envelope", defined by connecting apices of the amplified and modulated wave, is a substantially trapezoidal wave. In the carrier wave C, for example, each of times periods of rising portions $A_1$ and $A_2$, flat portions $S_1$, $S_2$, $S_3$ and $S_4$ and falling portions $D_1$, $D_2$ and $D_3$ is 10 μsec or less.

A plasma is generated in the processing chamber 52 by the waveform having at least rising and falling portions of 10 μsec or less in the carrier wave C obtained by the amplitude modulation, and the semiconductor wafer W or object to be processed is etched. For example, when $CF_4$ is used as reaction gas, the incidence energy can be applied to the etchant ions without progressing the dissociation of $CF_4$ to the final phase, and the etching rate can be increased. In FIG. 16, the carrier wave C is a substantially trapezoidal wave and the wave is amplitude-modulated so that the waveform characteristics thereof may become linear. However, needless to say, the waveform and amplification degree of the carrier wave C may be determined in accordance with the object to be etched and the mass and kind of etchant ions. For example, the rising and falling portions in the carrier wave C may be stepwise. Such waveform characteristics are obtained by modulation by means of, e.g. an A/D converter. The time point at which the carrier wave (envelope) is formed by the amplitude modulation may be in the beginning stage, intermediate stage or ending stage of the amplification process. However, modulation may be effected more easily in the beginning stage in which an output is still low. As to the amplification after modulation, a class A amplification mode in which an output current is produced over the entire time period of AC input is desirable since distortion of output is small.

Needless to say, with the power unit 101, too, device destruction on the semiconductor wafer W due to the aforementioned charge-up can be prevented.

A plasma can be closed in a plasma region by providing second electrodes 96 with use of support members 97, as shown in FIG. 17. The second electrodes 96 are subjected to alumite surface treatment and extended from the side wall of the processing chamber 52 into the plasma region. Thereby, the plasma density increases and accordingly the etching rate can be enhanced. By sealing the plasma, contamination of heavy metals, etc. and abnormal discharge due to sputtering on the inner wall of the processing chamber can be prevented. Furthermore, the waveform can be controlled in the same manner as above by connecting the second electrodes 96 to the power unit 81 vi a change-over switch.

In this embodiment, the parallel flat-plate type RIE apparatus is employed as a plasma processing apparatus using the power unit 81, 91 or 101. However, this embodiment is applicable to the magnetron RIE apparatus used in the embodiment 1. Moreover, the object to be processed may be LCD substrates, etc. as well as semiconductor wafers.

(Embodiment 3)

FIG. 18 shows schematically a plasma etching apparatus according to an embodiment of a plasma processing apparatus according to a third aspect of the present invention. The plasma etching apparatus has a cylindrical processing container 118 made of a conductor such as aluminum. The processing container 118 is grounded. A pair of electrodes, i.e. an upper electrode 120 and a lower electrode 122, which are placed apart at a distance of, e.g. about 20 to 30 mm, are arranged in parallel vertically. A space defined between these electrodes is formed as a plasma processing space.

The lower electrode 122 functioning as susceptor is formed of, e.g. alumite-processed aluminum in a substantially cylindrical shape. An object to be processed, e.g. a semiconductor wafer W, is placed on a top flat portion of the lower electrode 122. A ring-shaped damper member 124 is provided at a top peripheral portion of the lower electrode 122. The damper member 124 is engaged with a peripheral edge portion of the semiconductor wafer W, and the wafer W is fixed to the lower electrode 122.

The lower electrode 122 is coupled to, e.g an insulative pipe 126 inserted from the bottom of the processing container. A wire 128 connected to the lower electrode 122 is inserted in the pipe 126. The wire 128 is connected to a matching unit 130 and a first high-frequency power supply 132 of, e.g. 13.56 MHz. It is possible to form the insulative pipe 126 itself of a conductor and produce a high-frequency power by the skin effect. In this case, insulation between the pipe 126 and the elements through which the pipe 126 penetrates is ensured by design.

A first ground electrode 136 for grounding is provided below the lower electrode 122 with an insulator 134 of ceramics, etc. having a thickness of several-ten mm interposed. Thus, the electrode 136 is surely grounded. The first ground electrode 136 is made of aluminum, etc. with good conductivity having a thickness of several-ten mm. The first ground electrode 136 has such a container shape as to cover substantially the entire lower electrode 122 with the insulator 134 interposed.

A small gap $S_1$ is formed between the lower surface of the insulator 134 and the upper surface of the first ground electrode 136. An O-ring 138 is interposed between a lower surface of a peripheral portion of the insulator 134 and an upper surface of a peripheral portion of the first ground electrode 136 in order to seal the gap $S_1$. The gap $S_1$ communicates with a gas introducing passage 140 for introducing an insulative gas from below. For example, air of one atmospheric pressure is filled in the gap $S_1$ to form an insulative gas layer 142 for enhancing insulation properties between the lower electrode 122 and first ground electrode 136.

A metallic susceptor-supporting table 144 is provided below the lower electrode 122, and a lower portion of the table 144 is supported by an annular chamber bottom ring 146 attached to the container. The susceptor table 144 comprises, for example, a plurality of electrically conductive aluminum members combined such that they are put in surface contact with each other. The impedance of the combined body in the ground line is reduced as much as possible and the grounding is ensured.

A lower cooling jacket 148 for flowing a refrigerant in a circumferential direction is formed in the lower electrode 122. The jacket 148 is connected to a refrigerant introducing passage 50 and a refrigerant exhaust passage (not shown) for introducing and exhausting the refrigerant at the lower region.

On the other hand, the upper electrode 120 is formed of, e.g. amorphous carbon or aluminum in a disc-like shape. A processing gas supply header 151 or gas introducing means made of, e.g. aluminum is provided above the upper electrode 120. An engagement recess 152 is formed in a side portion of the header 151. The entire side portions of the upper electrode 120 and supply header 151 are covered with an electrical insulator 154 made of, e.g. ceramics or quartz. The entire upper electrode is supported on the side of processing container 118.

The upper electrode 120 is connected to a second high-frequency power supply 158 for generating a wave of high frequency of, e.g. 40 MHz via a matching unit 156 including a variable capacitor, etc. The power supply 158 applies a high-frequency power to the upper electrode 120. Accordingly, in the present embodiment, a high-frequency power is supplied to both the upper electrode 120 and lower electrode 122, thus constituting a so-called top-and-bottom plasma processing apparatus. A second ground electrode 160 for ensuring grounding is provided between the side portion of the upper electrode 120 and a side wall of the processing container 118. The insulator 154 is interposed between the upper electrode 120 and the second ground potential 160. The second ground electrode 160 is formed of, e.g. aluminum in a ring shape. The ground electrode 160 is surely grounded.

That lower surface of the second ground electrode 160, which faces the processing space, is subjected to, e.g. alumite treatment and is coated with a protection layer 162 of, e.g. $Al_2O_3$ with good anti-corrosion properties and insulation properties, in order to prevent damage to the ground electrode 160 due to plasma discharge. The lower end of the ground electrode 160 is substantially flush with the lower end of the upper electrode 120 situated inside of the ground electrode 160, thereby preventing occurrence of undesired deposition. The second ground electrode 160 can be demounted upwards when a top portion 118A of the processing container 118 is removed. If necessary, the ground electrode 160 can be exchanged easily.

The processing gas supply header 151 functions to supply a processing gas to the plasma processing space. The processing gas supply header 151 is connected to a gas introducing passage 168 for introducing an etching gas from an etching gas source 166. A hollow header chamber 164 enlarged horizontally according to the widening of the plate-shaped upper electrode 120 is formed at an end portion of the header 151. As is shown in FIG. 19, the plate-shaped upper electrode 120 is attached to the lower opening end of the header chamber 164. Many first gas holes 170 are formed in the upper electrode 120 with an equal pitch. Gas flows into the processing space from the header chamber 164 via the first gas holes 170.

In this embodiment, in order to manufacture, e.g. 16 MDRAM, very fine processing needs to be performed. For this purpose, the atmospheric pressure in the processing space is set at 0.5 Torr or less. In this case, in order to prevent a decrease in pressure in the header chamber 164, resistance applying means 172 is provided for applying a resistance to the flowing-out processing gas. This resistance applying means 172 characterizes the present invention. The resistance applying means is formed of, e.g. a cooling plate with second gas holes. The resistance to the flow-out processing gas can be freely chosen by varying the thickness of the cooling plate, the diameter of each second gas hole or each first gas hole, etc. Specifically, the resistance applying means has a resistance plate 174 made of, e.g. aluminum, and this plate 174 is interposed between the opening edge of the header chamber 164 and the upper electrode 120 and is fixed by bolts 176. This resistance plate 174 is provided with many gas holes 178 formed with an equal pitch so as to communicate with the associated first gas holes 170 formed in the upper electrode 120. FIG. 20 is a plan view illustrating this state.

The first gas holes 170 and second gas holes 178 are formed over substantially the entire upper electrode 120 and resistance plate 174 at equal pitches. The resistance to the processing gas flowing through these holes is determined by a diameter D1 of each first gas hole 70, each second gas hole 178, thickness H1 of the resistance plate 174, etc. By suitably selecting these values, the pressure in the header chamber 164 can be made higher than the process pressure in the processing space by a predetermined pressure difference.

In this case, the atmosphere in the header chamber 164 is set in the state in which it does not meet the law of Paschen which represents a limit of generation of plasma discharge. The law of Paschen represents the relationship between a discharge start voltage V, a discharge space pressure P and a distance L between the electrode and the discharge space. The above parameters are set to be fall outside a discharge generation region represented by this relationship. Specifically, in order to increase the pressure in the header chamber 164, the diameter D1 of each first gas hole 170 is set at 0.5 mm and the diameter D2 of each second gas hole 178. In addition, the pitch L1 of second gas holes 178 is set at about 6.35 mm. The thickness H1 of the resistance plate 174 which determines the distance from the upper electrode 120 is set at about 17 mm, so that plasma discharge does not occur. The resistance plate 174 can function as a cooling plate for cooling the upper electrode 120 by cool heat from the upper cooling jacket 180 provided in the processing gas supply header 151 for flowing refrigerant. In addition, two baffle plates 184 with many passage holes 182 are situated horizontal and set apart vertically at a predetermined distance, so that the processing gas introduced from the gas introducing passage 168 may be diffused uniformly in the header chamber 164.

An exhaust passage 186 for exhausting an atmosphere in the container is connected to a part of a side wall of the processing container 118. A load lock chamber 192 having a transfer arm 190 therein communicates with another side wall of the container via a gate 188. Thus, the semiconductor wafer W can be entered and taken out without losing a vacuum in the processing container 118. Another gate 194 is provided on the opposite side wall of the load lock chamber 192 for transfer of wafers with a wafer transfer system (not shown).

The operation of the plasma etching apparatus having the above structure will now be described.

Both the load lock chamber 192 and processing container 118 are kept in a vacuum state. A non-processed semiconductor wafer W held by the transfer arm 190 in the load lock chamber 192 is put into the processing container 118 via the gate 188. The semiconductor wafer W is firmly fixed on the lower electrode 122 by the damper member 124.

Then, the etching gas is fed into the gas introducing passage 168. Thereby, the processing gas fed into the header chamber 160 of processing gas supply header 151 is introduced into the processing container 118 through the second gas holes 178 in the resistance plate 174 and the first gas holes 170 in the upper electrode 120. At the same time, the inside of the processing container 118 is evacuated via the exhaust passage 186 and a predetermined low-pressure atmosphere is maintained in the processing container 118. A high-frequency wave of, e.g. 40 MHz is applied to the upper electrode 120 by the second high-frequency power supply 158, and a high-frequency wave of, e.g. 13.56 MHz is applied to the lower electrode 122 by the first high-frequency power supply 132. Thereby, a plasma discharge occurs between the upper electrode 120 and the lower electrode 122, and a plasma is induced from the etching gas in the processing space. Radicals in the produced plasma are adhered to the surface of the semiconductor wafer W and etching by a chemical reaction is performed. In addition, decomposed ions in the plasma are accelerated by an electric field produced between both electrodes 120 and 122 and are caused to impinge upon the semiconductor wafer W. For example, a polysilicon film is thus etched.

When a plasma is produced by causing a discharge between the upper and lower electrodes 120 and 122, the discharge is not stably effected unless the following coupling impedances are equal: an impedance of each high-frequency power supply 132, 158; a capacitive impedance of the discharge system, e.g. a capacitive impedance between the upper and lower electrodes; a capacitive impedance between the upper electrode 120 and the second ground electrode 160 situated around the upper electrode 120; and a capacitive impedance between the lower electrode 122 and the first ground electrode 136 situated around the lower electrode 122 or the container wall situated farther therefrom. Thus, at the time of discharge start, matching units 130 and 156 comprising, e.g. variable capacitors, which are connected in series to the high-frequency power supplies 132 and 158 are suitably adjusted and the impedances are matched. In this case, a main discharge is caused between the upper and lower electrodes 120 and 122, as with the conventional apparatus, but an inevitable, undesirable discharge occurs between the upper electrode 120 and the second ground electrode 160 provided nearer than the container wall and between the lower electrode 122 and the first ground electrode 136 provided nearer than the container wall.

In this manner, the first and second ground electrodes 136 and 160 are situated in the vicinity of the upper electrode 120 and lower electrode 122 in positions nearer than the container inner wall, thereby ensuring grounding and causing unnecessary discharge therebetween. Thus, the return efficiency of the matching at the time of discharge start is improved, and the impedance can be quickly stabilized with no fluctuation. As compared to the conventional apparatus, the impedance adjustment by the matching units 130 and 156 can be effected quickly, and the etching process can be started immediately. Therefore, the etching processing efficiency can be greatly improved.

With respect to the lower electrode 122, the lower portion thereof is covered with the first ground electrode 136 with the insulator 134 interposed, as described above, thereby ensuring grounding. An unnecessary charge at the lower electrode 122 escapes from the first ground electrode 136 since an unnecessary discharge occurs between both members directly or via the ceramic insulator 134 having a predetermined dielectric constant. Accordingly, the impedance adjustment can be performed quickly and stable plasma discharge can be maintained. Besides, the insulative gas layer 142 filled with a gas (air) of, e.g. 1 atmospheric pressure is placed in the gap $S_1$ between this insulator 134 and the first ground electrode 136 covering the lower portion thereof. Therefore, the insulation properties therebetween can be further improved.

Moreover, in the present embodiment, in order to perform very fine processing required for manufacturing, e.g. 16 MDRAM, the atmospheric pressure in the processing space is set at, e.g. 0.5 Torr or less which is lower than in the case of the conventional process. Accordingly, the inside of the header chamber 164 communicating via the first and second gas holes 170 and 178 is set at a reduced pressure, though slightly higher than the process pressure. Consequently, a plasma micro discharge may occur in the header chamber 164. However, in the present embodiment, by suitably setting the values of diameters D1 and D2 of first gas holes 170 formed in the upper electrode 120 and second gas holes 178 formed in the resistance plate 174, the pitch L1 of these gas holes 170 and 178 and the thickness H1 of the resistance plate 174, a resistance is applied to the gas flow and the atmospheric pressure in the header chamber 164 is slightly increased. In addition, this gas state is set to fall outside a plasma discharge region represented by the law of Paschen. Therefore, the plasma micro discharge does not occur in the header chamber 164, and aluminum particles of the material of the container wall, which occurs due to plasma discharge in the header chamber in the conventional apparatus, do not occur. Thus, the yield of products increases.

Simulation results of pressures in the header chambers of the conventional apparatus and the apparatus of this embodiment, in the case where the process pressure (pressure in the processing space) was set at 0.57 Torr, will now be shown. The set conditions are as follows: in the conventional apparatus, the thickness of the upper electrode is 3 mm, the diameter of the gas hole is 0.8 mm, the thickness of the resistance plate is 7 mm, and the diameter of the gas hole is 1.8 mm; in the present embodiment, the thickness of the upper electrode is 3 mm, the diameter of the gas hole is 0.5 mm, the thickness of the resistance plate is 17 mm, and the diameter of the gas hole is 2.0 mm. The gas flow rate was varied in the range of 50 to 600 SCCM, and the results shown in TABLE 1 were obtained:

TABLE 1

| Gas flow rate (SCCM) | Header chamber of conventional apparatus (Torr) | Header chamber of present embodiment (Torr) |
| --- | --- | --- |
| 600 | 0.8438 (0.2738) | 3.954 (3.384) |
| 400 | 0.7633 (0.1933) | 3.227 (2.675) |
| 200 | 0.6736 (0.1036) | 2.305 (1.735) |
| 50 | 0.5976 (0.0276) | 1.250 (0.680) |

*Pressure Rise Values (Pressure Differences) in Parentheses

In TABLE 1, the values in parentheses indicate pressure rise values (pressure differences) in comparison to the process pressure. According to this, in each flow rate in the present embodiment, the pressure difference in the header chamber in relation to the process pressure is much higher than in the conventional apparatus, and it is understood that a plasma micro discharge hardly occurs. When tests were actually conducted by using the conventional apparatus and the apparatus of the present embodiment, the following results were obtained.

The test conditions were as follows: in the conventional apparatus, the diameter of the gas hole is 120 mm, the pitch of the gas holes is 3.175 mm, and the thickness of the resistance plate is 11 mm; in the apparatus of the present embodiment, the diameter of the gas hole is 120 mm equal to that of the conventional apparatus, the pitch of the gas holes is 6.35 mm or double the pitch of the conventional apparatus, and the thickness of the resistance plate is 17 mm slightly greater than that of the conventional apparatus. The process pressure was set at 0.25 Torr. As processing gas, $CHF_3$ was supplied at 20 SCCM, $CF_4$ was supplied at 20 SCCM, and Ar was supplied at 400 SCCM. With the wafer gap set at 0.9 cm, plasma processing was performed for three minutes by high-frequency power of 800 W.

In the case of the conventional apparatus, the impurity concentration of aluminum was $1350 \times 10^{10}$ atm/cm$^2$. In the case of the apparatus of the present embodiment, it was $62 \times 10^{10}$ atm/cm$^2$. As a result, it was found that the contamination amount in the present embodiment decreased by 10 or more times, as compared to the conventional apparatus, and that occurrence of particles was remarkably curbed since the plasma micro discharge was curbed.

In the present embodiment, the diameter of each gas hole, pitch of gas holes and the thickness of the resistance plate were mentioned by way of example. Needless to say, various values may be chosen if the plasma micro discharge does not occur in the header chamber. In this embodiment, the high-frequency wave of 40 MHz is applied to the upper electrode 120, and the high-frequency wave of 13.56 MHz is applied to the lower electrode 122. The combination of the values of frequencies is not limited, and the frequency for the upper electrode and that for the lower electrode may be set at, e.g. 1 MHz and 380 KHz; 13.56 MHz and 13.56 MHz; or 380 KHz and 380 KHz, respectively.

Furthermore, the present embodiment is directed to the so-called top-and-bottom system in which high-frequency power is applied to both the upper electrode 120 and lower electrode 122. However, needless to say, the present invention is applicable to a so-called bottom-only system in which a high-frequency power is applied to the lower electrode 122 alone, and the upper electrode 120 is grounded, or to a so-called top-only system in which a high-frequency power is applied to the upper electrode 120 alone and the lower electrode 122 is grounded.

In the present embodiment, the plasma etching apparatus is used as plasma processing apparatus. However, the present invention is not limited to this. Needless to say, this invention is applicable to other plasma processing apparatuses such as a plasma ashing apparatus, a plasma CVD apparatus and a plasma sputtering apparatus.

As has been described above, according to the first aspect of the invention, the frequency modulation is performed and thereby the operation with high-frequency power and the operation with low-frequency power are independently achieved on the basis of time. For example, while the high-frequency power is being applied, the etching is facilitated. When the modulation with low-frequency power, ions are moved and neutralized with electrons on the object to be processed, without losing the caused dissociation state. As a result, the charge is canceled. Thereby, without substantially decreasing the plasma density and preventing the charge-up of the object, the device destruction by the charge-up phenomenon can be prevented. The structure for achieving this is very simple, and this structure is applicable to, e.g. the conventional plasma processing apparatus. In this case the modulation method to be adopted may be a frequency modulation method and an amplitude modulation method. In the case of the amplitude modulation, although the high-frequency power and low-frequency power are applied in an overlapping manner, the neutralization operation by the low-frequency power can simultaneously achieved with the pre-modulation plasma state maintained. The timing for effecting modulation may be determined on the basis of the value of the charge-up voltage occurring on the object.

According to the second aspect of the invention, there is provided a method in which a plasma is produced in the processing chamber by using power with the direction of current changed with passing of time, and the object in the processing chamber is processed in the plasma atmosphere. An electric power having a given basic frequency of, e.g. 380 kHz is frequency-modulated by a wave having a frequency n-times (n=natural number) the basic frequency. Thus, the power for plasma generation having a waveform different from a simple single sine waveform can be obtained. For example, if the plasma etching process is performed, a progress of gas molecule dissociation can be curbed, and ion bombardment of etchant ions can be controlled. The etching selection ratio can be enhanced and good anisotropic etching performed.

In the second aspect of the invention, frequency modulation can be effected by a plurality of different frequencies equal to n-times (n=natural number) the basic frequency, and thereby desired waveforms such as a pulse waveform, a sawtooth waveform, a triangular waveform and a ramp waveform can easily be produced. Thus, the dissociation phase in the plasma process can be controlled more finely and ion bombardment can be controlled. Thus, the etching rate can be enhanced further.

In the second aspect of the invention, the frequency modulation is controlled so that the reaction gas introduced in the processing chamber does not cause final-phase dissociation. Thereby, generation of excess etchant ions and unnecessary deposit can be avoided, and the selection ratio in the etching process can be increased.

In the second aspect of the invention, the frequency signal is divided in units of a cycle and frequency-modulation is effected. Thereby, dissociation of process gas molecules introduced into the processing chamber with a high-frequency component can be facilitated, or ion bombardment can be increased with a low-frequency portion. In this case, too, the frequency signal is divided in units of a cycle, e.g. half cycle, one cycle, several cycles or every several cycles and the frequency modulation is effected. Therefore, fine, high-precision control is possible.

Moreover, in the second aspect of the invention, amplitude modulation is effected on high-frequency power, and the time of rising and falling portions of the obtained envelope is set at 10 $\mu$sec or less. Thereby, for example, in the etching process, this time period is made less than the dissociation reaction time of gas molecules related directly to the etching reaction. In these portions, dissociation of gas molecules does not progress, and accordingly the dissociation can be controlled at the portions excluding the rising and falling portions.

According to the third aspect of the invention, the resistance applying means is provided for making the pressure in the gas introducing means higher than the pressure in the processing space. Thus, even if the pressure in the processing space is set at 0.5 Torr or less, the plasma micro discharge in the supply header can be curbed and the occurrence of particles can remarkably be curbed.

What is claimed is:

1. A plasma processing apparatus, comprising:

a processing chamber;

a first electrode having gas introducing means;

a first gas introducing hole formed in said first electrode;

a second electrode provided opposite said first electrode;

a resistance applying means having a resistance plate provided with a second gas introducing hole formed therein, wherein a process gas is supplied to said processing chamber via said first gas introducing hole formed in said first electrode, an object to be processed held on said second electrode is subjected to plasma processing, said resistance applying means applies resistance to the process gas flowing to said processing chamber via said first gas introducing hole from said gas introducing means such that a plasma discharge is prevented from occurring under a condition of a process pressure less than 0.5 Torr in said processing chamber, said resistance plate is provided between said first electrode and said gas introducing means, and the resistance to the flowing process gas is varied by varying at least a thickness of said resistance plate, a pitch of one of said first and second gas introducing holes, and a diameter of one of said first and second gas introducing holes.

2. A plasma processing apparatus, comprising:

a processing chamber;

first and second electrodes provided in the processing chamber and facing each other to form a plasma processing space therebetween, the first electrode supporting an object to be processed thereon, and the second electrode having a plurality of first gas introducing holes;

process gas introducing means having a chamber communicating with the plasma processing space through the first gas introducing holes in the second electrode;

gas supply means for supplying a process gas into the chamber in the process gas introducing means, so that the process gas flows into the plasma processing space through the first gas introducing holes;

means for evacuating the processing chamber so that a gas pressure in the plasma processing space allows plasma to be formed in the plasma processing space;

means for generating plasma in the plasma processing space; and resistance applying means provided between the chamber of the process gas introducing means and the second electrode for applying resistance to the process gas flowing to the plasma processing space from the chamber thereby increasing a gas pressure in the chamber to be greater than the gas pressure in the plasma processing space so as to prevent generation of plasma in the chamber, wherein said resistance applying means has a resistance plate electrically and thermally connected to the second electrode and a plurality of second gas introducing holes formed in the resistance plate so that the chamber communicates with the first gas introducing holes through the second gas introducing holes, said second gas introducing holes are respectively coaxially aligned with the corresponding first gas introducing holes, and each of the second gas introducing holes has a larger diameter than that of each of the first gas introducing holes, and a thickness of said resistance plate, a pitch and a diameters of at least one of the second gas introducing holes and the first gas introducing holes are changed to vary the resistance of the flowing process gas.

* * * * *

UNITED STATES PATENT AND TRADEMARK OFFICE
CERTIFICATE OF CORRECTION

PATENT NO. : 6,110,287
DATED : Aug. 29, 2000
INVENTOR(S) : Izumi ARAI, et al.

It is certified that error appears in the above-identified patent and that said Letters Patent is hereby corrected as shown below:

On the Title Page, Item [73], the Assignee information is incorrect. Item [73] should read as follows:

--- [73] Assignee: Tokyo Electron Limited, Tokyo, Japan ---

Signed and Sealed this

Fifth Day of June, 2001

Attest:

Attesting Officer

NICHOLAS P. GODICI

*Acting Director of the United States Patent and Trademark Office*